United States Patent
Zheng et al.

(10) Patent No.: US 12,219,859 B2
(45) Date of Patent: Feb. 4, 2025

(54) DISPLAY PANEL INCLUDING CONTACT ELECTRODE CONTACTING CATHODE LAYER AND DISPLAY DEVICE HAVING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Jiexin Zheng, Shenzhen (CN); Wei Lu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/430,890

(22) PCT Filed: Jun. 4, 2021

(86) PCT No.: PCT/CN2021/098434
§ 371 (c)(1),
(2) Date: Aug. 13, 2021

(87) PCT Pub. No.: WO2022/227228
PCT Pub. Date: Nov. 3, 2022

(65) Prior Publication Data
US 2024/0251634 A1    Jul. 25, 2024

(30) Foreign Application Priority Data

Apr. 27, 2021 (CN) .......................... 202110460222.1

(51) Int. Cl.
*H01L 29/08* (2006.01)
*H10K 59/122* (2023.01)
*H10K 59/80* (2023.01)

(52) U.S. Cl.
CPC ..... *H10K 59/80522* (2023.02); *H10K 59/122* (2023.02)

(58) Field of Classification Search
CPC ....................... H10K 59/00522; H10K 59/122
(Continued)

(56) References Cited

U.S. PATENT DOCUMENTS

2013/0087814 A1* 4/2013 Moon .................. H01L 33/62
257/E33.062
2016/0181350 A1 6/2016 Lee
(Continued)

FOREIGN PATENT DOCUMENTS

CN           1825614 A      8/2006
CN         101599534 A     12/2009
(Continued)

OTHER PUBLICATIONS

Chinese Office Action issued in corresponding Chinese Patent Application No. 202110460222.1 dated Mar. 30, 2022, pp. 1-7.
(Continued)

*Primary Examiner* — Phuc T Dang
(74) *Attorney, Agent, or Firm* — PV IP PC; Wei Te Chung

(57) ABSTRACT

A display panel and a display device are disclosed. The display panel includes an array substrate, an electrode layer disposed on the array substrate, a light-emitting layer disposed on the electrode layer, and a cathode layer disposed on the light-emitting layer. The electrode layer includes an anode and a contact electrode disposed apart from each other on the array substrate. The contact electrode has a pattern,
(Continued)

the contact electrode contacts the cathode layer through the light-emitting layer.

20 Claims, 3 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2020/0106039 | A1* | 4/2020 | Li | .......................... H10K 50/824 |
| 2022/0052137 | A1* | 2/2022 | Song | ..................... H10K 59/124 |

FOREIGN PATENT DOCUMENTS

| | | | | |
|---|---|---|---|---|
| CN | 104752439 | A | 7/2015 | |
| CN | 107611283 | A | 1/2018 | |
| CN | 108122944 | A | 6/2018 | |
| CN | 108933154 | A | 12/2018 | |
| CN | 109037282 | A | 12/2018 | |
| CN | 109148527 | A | 1/2019 | |
| CN | 109244269 | A | 1/2019 | |
| CN | 109560117 | A | 4/2019 | |
| CN | 110854290 | A | 2/2020 | |
| CN | 111129089 | A | 5/2020 | |
| CN | 112289945 | A | 1/2021 | |
| EP | 3712951 | A1 * | 9/2020 | ......... H01L 27/3246 |
| KR | 20160141315 | A | 12/2016 | |
| KR | 20200113056 | A * | 10/2020 | ........... H10K 59/123 |

OTHER PUBLICATIONS

International Search Report in International application No. PCT/CN2021/098434, mailed on Jan. 27, 2022.

Written Opinion of the International Searching Authority in International application No. PCT/CN2021/098434, mailed on Jan. 27, 2022.

* cited by examiner

DISPLAY PANEL INCLUDING CONTACT ELECTRODE CONTACTING CATHODE LAYER AND DISPLAY DEVICE HAVING THE SAME

CROSS REFERENCE TO RELATED APPLICATIONS

The present disclosure is a Notional Phase of PCT Patent Application No. PCT/CN2021/098434 having international filing date of Jun. 4, 2021, which claims priority to China Application No. 202110460222.1, entitled "DISPLAY PANEL AND DISPLAY DEVICE", filed on Apr. 27, 2021, which is herein incorporated by reference in its entirety.

FIELD OF INVENTION

The present disclosure relates to the field of display technology, and more particularly, to a display panel and a display device.

BACKGROUND OF INVENTION

In panel display industry, active-matrix organic light-emitting diode (AMOLED) displays have higher color saturation and lower energy consumption than liquid crystal displays (LCD), and are favored by major screen manufacturers. With the diversified customer needs for large screen and high quality, the display panels are developing towards large sizes and high resolution. With the increase of panel sizes, some defects of small and medium size are gradually exposed, in which the brightness uniformity of the panel gradually deteriorates as the size increases.

Through analysis, the reasons for the decrease of the brightness uniformity of the display panel are as follows: 1) the electrical property of a pixel circuit of the OLED panel is nonuniform, resulting from the uniformity of film formation and etching of an active layer and related inorganic layers. 2) when the metal wirings in the display panel become longer, the wiring resistances and parasitic capacitances increase, such as to increase the RC loadings of the panel away from a signal input end. As a result, the charging of the data signal is insufficient, so that pixel current away from the input end is smaller than pixel current near the input end, which results in the brightness difference. 3) The OLED device is a current-driven device. According to the formula: $U=I*R$, there are different VDD/VSS voltage drops (also known as IR Drop effect) at each position when the display panel is lighted on. The decrease of VDD and the increase of VSS may lower the pixel brightness, resulting in the nonuniform brightness of the panel.

With respect to the nonuniform brightness caused by IR drop effect, an auxiliary electrode may be provided, so that a resistance value is reduced by connecting a cathode layer with the auxiliary electrode in parallel. The parallel resistance of the cathode and the auxiliary electrode is mainly affected by the structure of a contact hole.

FIG. 1 is a structural schematic diagram of a contact hole of a cathode in an existing display panel. As shown in FIG. 1, in the contact hole 900, the auxiliary electrode 91 is disposed under an anode 92 and electrically connected with the anode 92, a light-emitting layer 93 is disposed on the anode 92, and a cathode layer 94 is disposed on the light-emitting layer 93. Obviously, the organic light-emitting material between the anode 92 and the cathode layer 94 may affect the resistance between the auxiliary electrode and the cathode layer.

In particular, for the large-size display panel, when the pixel design of the display panel is a side-by-side manner and the OLED device is manufactured by inkjet printing, an organic layer of a light-emitting device may cover the contact hole and affect the resistance between the auxiliary electrode and the cathode layer. For example, the light-emitting layer of the light-emitting device may cover the contact hole of the auxiliary electrode. Therefore, the resistance of the contact hole is mainly affected by the resistance of the organic layer between the auxiliary electrode and the cathode.

During the research and practice of the prior art, the applicant of the present disclosure develops a display panel and display device to solve the above technical problems.

SUMMARY OF INVENTION

Technical Problem:

The objective of the present disclosure is to provide a display panel and a display device, which can overcome the influence of the light-emitting layer on the parallel resistance of the auxiliary electrode and the cathode to lower the resistance of the cathode layer, so as to reduce IR Drop effect of the whole display panel.

Technical Solutions:

The present disclosure provides a display panel, which includes an array substrate, an electrode layer disposed on the array substrate, a light-emitting layer disposed on the electrode layer, and a cathode layer disposed on the light-emitting layer;

wherein the array substrate is provided with an auxiliary electrode, and the electrode layer includes an anode and a contact electrode disposed apart from each other on the array substrate;

wherein the contact electrode has a pattern, the contact electrode contacts the cathode layer through the light-emitting layer, and the auxiliary electrode is electrically connected with the contact electrode;

wherein the electrode layer includes:

a metal electrode layer disposed on the array substrate; and at least one transparent electrode layer disposed between the metal layer and the array substrate or the light-emitting layer.

Optionally, in some embodiments of the present disclosure, the display panel further includes a pixel definition layer disposed between the electrode layer and the light-emitting layer;

the pixel definition layer has a pixel opening exposing the anode and a contact hole exposing the contact electrode;

both the light-emitting layer and the cathode layer extend into the contact hole, and the contact electrode contacts the cathode layer through the light-emitting layer in the contact hole.

Optionally, in some embodiments of the present disclosure, the pattern of the contact electrode is a concentric multi-ring pattern.

Optionally, in some embodiments of the present disclosure, the array substrate includes:

a substrate;

a driving circuit layer disposed on the substrate;

a planarization layer disposed on one side of the driving circuit layer away from the substrate;

wherein the anode and the contact electrode are disposed on one side of the planarization layer away from the driving circuit layer, and the auxiliary electrode is disposed in the driving circuit layer and electrically connected with the contact electrode through a via hole.

Optionally, in some embodiments of the present disclosure, the array substrate is further provided with an auxiliary electrode wiring, the auxiliary electrode wiring and the auxiliary electrode are disposed on the same layer, and the auxiliary electrode wiring is electrically connected with the auxiliary electrode Optionally, in some embodiments of the present disclosure, an extension direction of the auxiliary electrode wiring is equal to an extension direction of a data line of the driving circuit layer.

Optionally, in some embodiments of the present disclosure, the driving circuit layer includes a thin film transistor, and the auxiliary electrode and a source and a drain of the thin film transistor are disposed on a same layer.

A display panel including an array substrate, an electrode layer disposed on the array substrate, a light-emitting layer disposed on the electrode layer, and a cathode layer disposed on the light-emitting layer;

wherein the electrode layer includes an anode and a contact electrode disposed apart from each other on the array substrate;

wherein the contact electrode has a pattern, and the contact electrode contacts the cathode layer through the light-emitting layer.

Optionally, in some embodiments of the present disclosure, the display panel further includes a pixel definition layer disposed between the electrode layer and the light-emitting layer;

the pixel definition layer has a pixel opening exposing the anode and a contact hole exposing the contact electrode;

both the light-emitting layer and the cathode layer extend into the contact hole, and the contact electrode contacts the cathode layer through the light-emitting layer in the contact hole.

Optionally, in some embodiments of the present disclosure, the pattern of the contact electrode is a concentric multi-ring pattern.

Optionally, in some embodiments of the present disclosure, the electrode layer includes:

a metal electrode layer disposed on the array substrate; and at least one transparent electrode layer disposed between the metal layer and the array substrate or the light-emitting layer.

Optionally, in some embodiments of the present disclosure, the array substrate is provided with an auxiliary electrode, and the auxiliary electrode is electrically connected with the contact electrode.

Optionally, in some embodiments of the present disclosure, the array substrate includes:

a substrate;

a driving circuit layer disposed on the substrate;

a planarization layer disposed on one side of the driving circuit layer away from the substrate;

wherein the anode and the contact electrode are disposed on one side of the planarization layer away from the driving circuit layer, and the auxiliary electrode is disposed in the driving circuit layer and electrically connected with the contact electrode through a via hole.

Optionally, in some embodiments of the present disclosure, wherein the array substrate is further provided with an auxiliary electrode wiring, the auxiliary electrode wiring and the auxiliary electrode are disposed on a same layer, and the auxiliary electrode wiring is electrically connected with the auxiliary electrode Optionally, in some embodiments of the present disclosure, an extension direction of the auxiliary electrode wiring is equal to an extension direction of a data line of the driving circuit layer.

Optionally, in some embodiments of the present disclosure, the driving circuit layer includes a thin film transistor, and the auxiliary electrode and a source and a drain of the thin film transistor are disposed on a same layer.

Correspondingly, the present disclosure further provides a display device including a display panel, wherein the display panel includes an array substrate, an electrode layer disposed on the array substrate, a light-emitting layer disposed on the electrode layer, and a cathode layer disposed on the light-emitting layer;

wherein the electrode layer includes an anode and a contact electrode disposed apart from each other on the array substrate;

wherein the contact electrode has a pattern, and the contact electrode contacts the cathode layer through the light-emitting layer.

Beneficial Effect:

In comparison with the prior art, in embodiments of the present disclosure, the display panel and the display device are provided with the contact electrode apart from the anode on the array substrate, in which the contact electrode is patterned. As a result, the contact electrode can directly pierce the light-emitting layer and/or the organic functional layer to electrically connect the cathode layer, so as to reduce the resistance of the cathode layer, thereby reducing IR Drop effect of the whole display panel.

DETAILED DESCRIPTION OF PREFERRED EMBODIMENTS

A display panel and A display device are provided in embodiment of the present disclosure, which are described in detail below. It should be noted that the order of description of the following embodiments is not a limitation on the preferred order of the embodiments.

Figure 1:
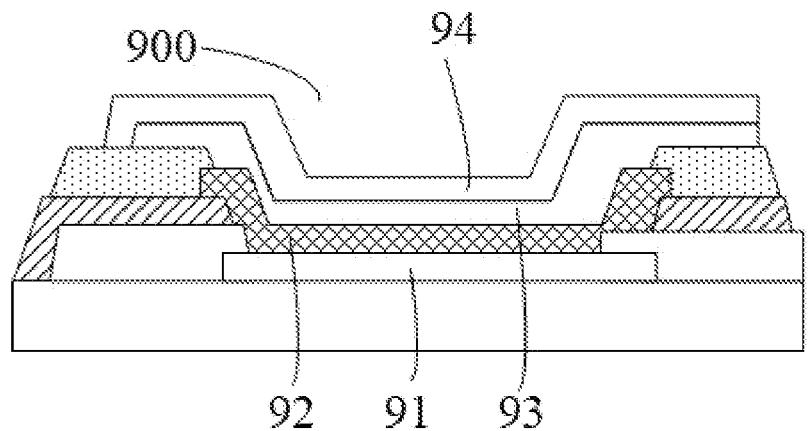
FIG. 1 is a structural schematic diagram of a contact hole of a cathode in an existing display panel.
Figure 2:
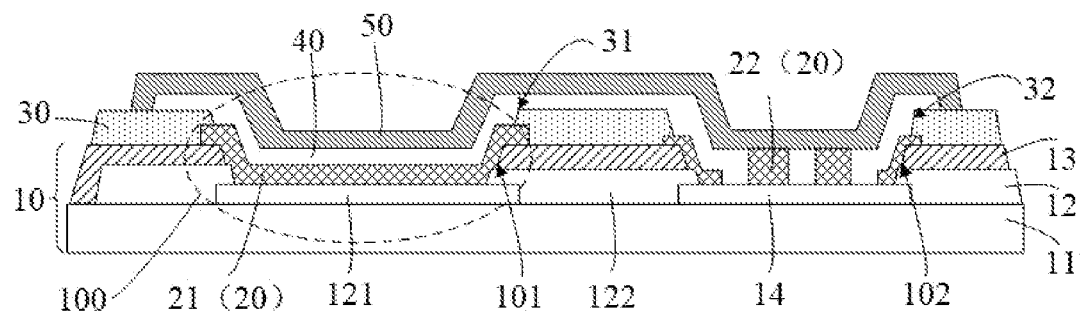
FIG. 2 is a plan diagram of a display panel provided by embodiments of the present disclosure.

As shown in FIG. 2, a display panel is provided in the present disclosure, which includes an array substrate 10, an electrode layer 20, a light-emitting layer 40, and a cathode layer 50.

Reference is made to FIG. 2. The electrode layer 20 is disposed on the array substrate 10, the light-emitting layer 40 is disposed on one side of the electrode layer 20 away from the array substrate 10, and the cathode layer 50 is disposed on one side of the light-emitting layer 40 away from the electrode layer 20.

Reference is made to FIG. 2. The electrode layer 20 includes an anode 21 and a contact electrode 22 which are disposed apart from each other on the array substrate 10. The anode 21 is disposed in a continuous manner. The contact electrode 22 has a pattern, and the contact electrode 22 contacts the cathode layer 50 through the light-emitting layer 40.

To this end, in the display panel of the present disclosure, by disposing the contact electrode 22, which is disposed on the array substrate 10, on the same layer as the anode 21 and apart from the anode 21 and patterning the contact electrode 22, the contact electrode 22 can pierce the light-emitting layer to contact the cathode layer 50, which may decrease the resistance of the cathode layer 50, thereby reducing IR Drop effect of the whole display panel.

Reference is made to FIG. 2. The array substrate 10 is provided with the auxiliary electrode 14, and the contact electrode 22 is electrically connected with the auxiliary electrode 14.

In this scheme, the auxiliary electrode 14 is electrically connected with the cathode layer 50 through the contact electrode 22, which decreases the parallel resistance of the auxiliary electrode 14 and the cathode layer 50 to reduce the resistance of the cathode layer 50, thereby reducing the voltage drop (IR drop) effect of the display panel and improving the display uniformity of the display panel.

As shown in FIG. 2, the display panel includes the array substrate 10, the electrode layer 20, the light-emitting layer 40, and the cathode layer 50.

Specifically, in addition to the auxiliary electrode 14, the array substrate further includes a substrate 11, a driving circuit layer 12, and a planarization layer 13. The substrate 11 may be a rigid substrate, such as glass, transparent resin, or may be a flexible substrate, such as polyimide, polycarbonate, polyethersulfone, polyethylene terephthalate, polyethylene naphthalate, polyaryl compound, glass fiber reinforced plastic. The present disclosure does not limit the materials of the substrate 11.

Reference is made to FIG. 2. The driving circuit layer 12 is disposed on the substrate 11. Since the driving circuit layer 12 is not the improvement focus of the present disclosure, FIG. 2 does not show all the film layer structures of the driving circuit layer 12, and only the structure of the driving circuit layer 12 is briefly described below.

Reference is made to FIG. 2. In some embodiments, the auxiliary electrode 14 is disposed in the driving circuit layer 12. Furthermore, reference is made to FIG. 3. The driving circuit layer 12 is further provided with an auxiliary electrode wiring 141, which is electrically connected with the auxiliary electrode 14. The auxiliary electrode 14 is connected to a driving end of the cathode through the auxiliary electrode wiring 141 to realize the parallel arrangement of the auxiliary electrode 14 and the cathode layer 50, thereby reducing IR drop effect of the display panel and improving the display uniformity of the display panel.

In a preferred embodiment, the auxiliary electrode 14 and the auxiliary electrode wiring 141 are disposed on the same layer. Furthermore, the auxiliary electrode 14 and/or the auxiliary electrode wiring 141 can be disposed on the same layer as the wiring or electrode of the driving circuit layer 12. In such configuration, the display panel process can be reduced. Moreover, the thickness of the array substrate 10 can be prevented from increasing.

Certainly, in other embodiments, the auxiliary electrode 14 and/or the auxiliary electrode wiring 141 may be disposed on different film layers of the driving circuit layer 12, and electrically connected through a bridge structure.

In the present embodiment, the driving circuit layer 12 includes a thin film transistor. The thin film transistor includes an active layer, a gate insulating layer, a gate, an interlayer dielectric layer, a source, a drain 121, and a passivation layer 122.

Specifically, the active layer is disposed on the substrate. The gate insulation layer is disposed on the active layer and covers the active layer and the substrate. The gate is disposed on one side of the gate insulation layer away from the active layer, and the projection of the gate projected on the substrate is within the projection of the active layer projected on the substrate. Both the source and the drain are disposed on one side of the gate insulation layer away from the gate, and contact the active layer through the via holes, respectively. The passivation layer 122 is disposed on the source and the drain 121, and covers the source, the drain 121, the active layer, and the gate insulation layer.

In some embodiments, the auxiliary electrode 14 and the auxiliary electrode wiring 141 are disposed on the same layer as the source and the drain 121 of the thin film transistor.

Furthermore, the driving circuit layer 12 further includes a plurality of wirings, which include, but are not limited to, data line 123 and signal line. In specific implementations, the data line 123 is also disposed on the same layer as the source and the drain 121 of the thin film transistor. At this time, the auxiliary electrode wiring 141, the data line 123, the source, and drain 121 are disposed on the same layer.

As a preferred embodiment, an extension direction of the auxiliary electrode wiring 141 is the same as an extension direction of the data line 123.

In specific implementations, the gate, the source, and the drain 121 may include metal, alloy or metal nitrides. For example, the gate may include metal, such as aluminum (AL), silver (Ag), tungsten (W), copper (Cu), nickel (Ni), chromium (CR), molybdenum (MO), titanium (TI), platinum (PT), tantalum (TA), and Nd (nd), alloy thereof and/or nitrides thereof.

In specific implementations, the active layer may include silicon compounds such as polysilicon. In some embodiments, the source area and drain area which includes p-type or N-type impurities may be formed at two ends of the active layer. In some embodiments, the active layer may include oxide semiconductor, such as indium gallium zinc oxide (IGZO), zinc oxide tin (ZTO), indium tin oxide zinc oxide (ITZO), and/or similar materials.

In specific implementations, the material of the passivation layer 122 may include organic materials, such as polyimide, epoxy resin, acrylic resin, polyester, and/or similar materials.

It is noted that the above is only exemplary embodiments of the thin film transistor. In specific implementations, the thin film transistor may further use other structures or types of thin film transistor. For example, the thin film transistor can also be top-gate indium gallium zinc oxide (IGZO) TFT, top-gate indium gallium zinc titanium oxide (IGZTO) TFT, or back channel etched (BCE) IGZO TFT.

In specific implementations, the driving circuit layer 12 may further include functional elements, such as a capacitor, a resistance, or a coil.

Reference is made to FIG. 2. The planarization layer 13 is disposed on the driving circuit layer 12, and the planarization layer 13 covers the driving circuit layer 12.

In this scheme, on the one hand, the planarization layer 13 may be used to protect the driving circuit layer 12. On the other hand, since the driving circuit layer 12 has complex film structure, the top surface may be uneven. One side of the planarization layer 13 away from the driving circuit layer 12 has a basic plane or flat top surface, which planarizes the surface of the driving circuit layer 12, thereby facilitating manufacturing the subsequent film layers.

In the present embodiment, the array substrate 10 has a first via hole 101 and a second via hole 102. The first via hole 101 penetrates through the passivation layer 122 and the planarization layer 13 to expose the drain 121, and the second via hole 102 penetrates through the passivation layer 122 and the planarization layer 13 to expose the auxiliary electrode 14.

In specific implementations, the planarization layer 13 may be a single or multi-layer formed of organic and/or inorganic materials.

As shown in FIG. 2, the electrode layer 20 is disposed on the array substrate 10, and the electrode layer 20 includes the anode 21 and the contact electrode 22 spaced from each other.

Reference is made to FIG. 2. In the present embodiment, the anode 21 and the contact electrode 22 are disposed on the planarization layer 13. The anode 21 is electrically connected to the drain 121 of the thin film transistor through the first via hole 101, and the contact electrode 22 is electrically connected to the auxiliary electrode 14 through the second via hole 102.

Specifically, the display area of the array substrate 10 includes a plurality of sub-pixel areas arranged in an array. Each of the sub-pixel areas is provided with one anode 21. The contact electrodes 22 are disposed in such a way that each of the sub-pixel areas is provided with one or more of the contact electrodes 22. Alternatively, the contact electrodes 22 are disposed in a portion of the sub-pixel areas.

Reference is made to FIG. 2. In the present embodiment, the sub-pixel areas include red sub-pixel areas, green sub-pixel areas, and blue sub-pixel areas. The adjacent red sub-pixel area, green sub-pixel area and blue sub-pixel area form one pixel area. The contact electrode can be disposed in such a way that each pixel area is provided with one contact electrode. In specific implementations, the contact electrode can be disposed in any one of the red sub-pixel area, green sub-pixel area and blue sub-pixel area.

In specific implementations, the number and position of the contact electrodes 22 can be adjusted according to the configuration of the cathode layer 50 and/or the auxiliary electrode 14. For example, in some embodiments, the auxiliary electrode 14 is also disposed in the non-display area. At this time, the contact electrode 22 can be disposed in the non-display area, and the present disclosure is not limited thereto.

Specifically, the anodes 21 are disposed in a continuous manner. More specifically, the anode 21 is not provided with a pattern.

Specifically, the contact electrode 22 has a pattern such that the contact electrode 22 has one or more edges.

Figure 4:
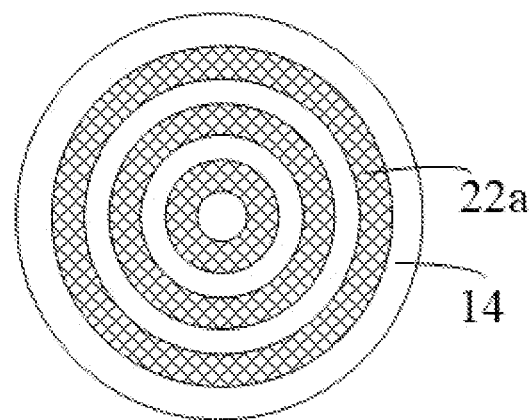
FIG. 4 is a first embodiment of the contact electrode in FIG. 2.
Figure 5:
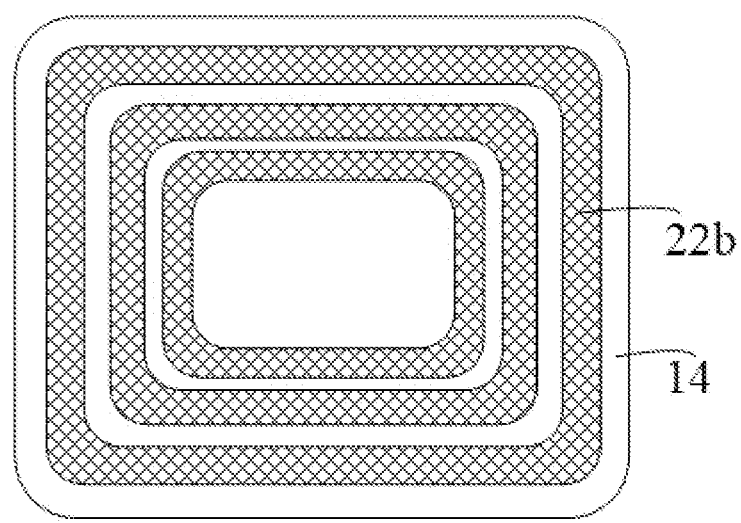
FIG. 5 is a second embodiment of the contact electrode in FIG. 2.

References are made to FIG. 4 and FIG. 5. Two implementations of the contact electrode are provided in embodiments of the present disclosure. The pattern of the contact electrode 22a in FIG. 4 is concentric ring-shaped, and the pattern of the contact electrode 22b in FIG. 5 is concentric square ring-shaped.

Reference is made to FIG. 4. In the direction from the center to the edge, the contact electrode 22a includes a plurality of ring-shaped sub-electrodes arranged in sequence and with gradually increasing inner diameters, and the ring-shaped sub-electrodes are disposed apart from each other.

Reference is made to FIG. 5. In the direction from the center to the edge, the contact electrode 22b includes a plurality of square ring sub-electrodes arranged in sequence and with gradually increasing inner diameters, and the square ring sub-electrodes are disposed apart from each other.

In other embodiments, the pattern of the contact electrode 22 can be realized in the form of a plurality of strip sub-electrodes arranged at parallel intervals, or in the form of a plurality of square sub-electrode blocks arranged in an array.

Specifically, the contact electrode 22 and the anode 21 are homogeneous on the same layer. Furthermore, the contact electrode 22 and the anode 21 can be obtained by the same process, which can prevent the process of the display panel from increasing.

During manufacturing, the contact electrode 22 can be directly obtained from the film used to manufacture the anode 21. At this time, the patterning of the contact electrode 22 can also be completed simultaneously in the pattern manufacturing process of the anode 21. In such configuration, the contact electrode 22 and the anode 21 of the present disclosure can be obtained at the same time only by adjusting the pattern of the mask for the anode 22, which can save the process steps, decrease the number of the masks, and reduce the manufacturing costs.

Specifically, the electrode layer 20 includes a metal electrode layer and at least one transparent electrode layer. The transparent electrode layer is disposed between the metal electrode layer and the planarization layer 13, or on one side of the metal electrode layer away from the planarization layer 13.

In specific use, the metal electrode layer can also play the role of shading or reflection, and enhance the luminous brightness and display effect of the display panel.

In schemes of the present disclosure, the contact electrode 22 is a multilayer structure including a metal electrode layer and a transparent electrode layer. Therefore, during the patterning etching, the etching selectivity ratios of the metal electrode layer and the transparent electrode layer are different, such that the metal electrode layer may be exposed at the edge area of the contact electrode. In the condition without covering or overspreading of the organic layer, the metal electrode layer may be corroded to be enlarged or expanded due to the influence of subsequent process, so that the whole contact electrode 22 is enlarged or expanded to pierce through the film layer covering the contact electrode.

In specific implementations, the material of the metal electrode layer is formed of one or more of silver (Ag), magnesium (mg), aluminum (AL), platinum (PT), palladium (PD), gold (AU), nickel (Ni), neodymium (Nd), iridium (Ir), chromium (Cr). Preferably, the material of the metal electrode layer is Ag. That is, the metal electrode layer is a silver layer.

In specific implementations, the transparent electrode layer may be made of transparent materials or translucent materials. The transparent material may be, but not limited to, one or more of the materials, such as indium tin oxide (ITO), indium zinc oxide (IZO), zinc oxide (ZnO), indium oxide (In2O3).

Figure 3:
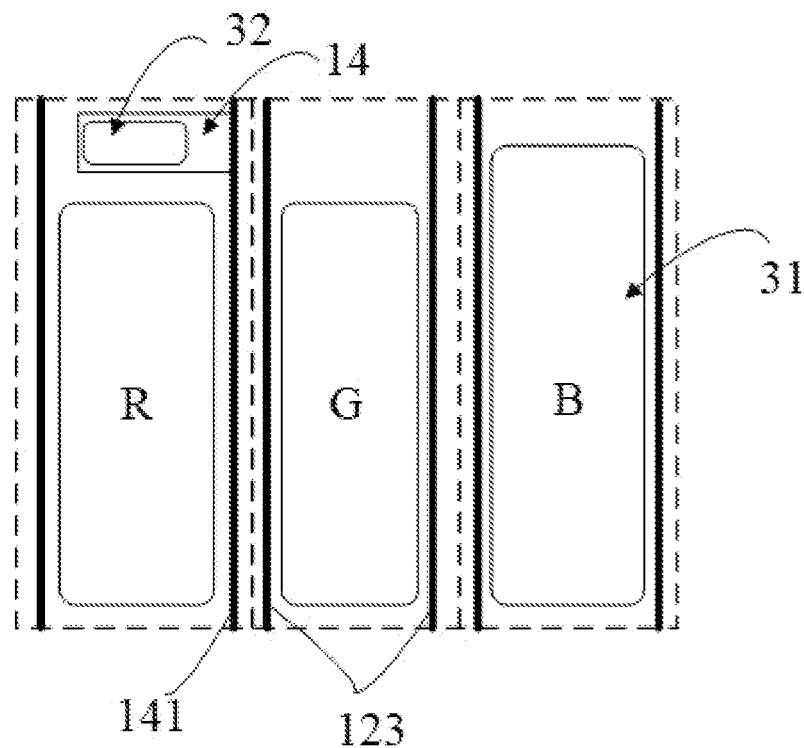
FIG. 3 is a cross-sectional diagram of a display panel provided by embodiments of the present disclosure.

References are made to FIG. 2 and FIG. 3. The display panel further includes a pixel definition layer 30, which is disposed on the electrode layer 20. More specifically, the pixel definition layer 30 is disposed on the contact electrode 22 and the anode 21.

The pixel definition layer 30 is provided with a pixel opening 31 corresponding to the anode 21 and a contact hole 32 corresponding to the contact electrode 22. The pixel opening 31 is used to define the light-emitting device 100. The contact hole 32 is located on the periphery of the pixel opening 31.

Specifically, the pixel definition layer 30 covers the edge of the anode 21, and the anode 21 is exposed by the pixel opening 31. In the pixel opening 31, the anode 21 is disposed in a continuous manner. In such configuration, the edge of the anode 21 is completely covered by the pixel definition layer 30, the area exposed by the pixel opening 31 is continuous, thereby preventing the metal electrode layer of the anode 21 from being exposed and preventing the anode 21 from penetrating the light-emitting layer 40 and connecting the cathode layer 50. As a result, the direct contact short between the anode 21 and cathode layer 50, which forms a defective pixel, can be avoided.

On the contrary, in the contact hole 32, the contact electrode 22 has a pattern, so that the contact electrode 22 has one or more edges for encircling the pattern in the contact hole 32. In other words, a portion of the edge of the contact electrode 22 is exposed by the contact hole 32 and is not covered by the pixel definition layer 30.

As described above, the metal electrode layer of the contact electrode 22 is enlarged and expanded in the subsequent process, so that the whole contact electrode 22 is enlarged and expanded. In this case, in the contact hole 32, the contact electrode 22 may be expanded and enlarged to pierce the light-emitting layer 40, and thus the contact electrode 22 is electrically connected with the cathode layer 50.

Reference is made to FIG. 2, the light-emitting layer 40 is disposed on the pixel definition layer 30, and the light-emitting layer 40 covers the pixel definition layer 30, the anode 21 and the contact electrode 22.

Specifically, the light-emitting layer 40 is formed by light-emitting materials used for producing red, blue, green or white light. The light-emitting layer 40 can emit red light, blue light, green light or white light under the action of voltages of cathode and anode.

For example, in the present embodiment, the material of the light-emitting layer 40 may be organic light-emitting materials. In other embodiments, the material of the light-emitting layer 40 may also be quantum dot light-emitting materials.

In other embodiments, the display panel may further include an organic functional layer. The organic functional layer is disposed between the light-emitting layer and the anode or cathode layer.

The organic functional layer may be, but not limited to, at least one or more of the hole injection layer, hole transport layer, electron transport layer or electron injection layer.

In the present embodiment, in order to ensure the contact effect and stability of the contact electrode 22 and the cathode layer 50, the organic functional layer is disposed separately for each light-emitting device without extending into the contact hole.

In other embodiments, when the organic functional layer extends into the contact hole 32, the contact electrode 22 penetrates the organic functional layer.

As shown in FIG. 2, the cathode layer 50 is disposed on one side of the light-emitting layer 40 away from the array substrate 10.

In some embodiments, the cathode layer 50 may be arranged in such a way that a cathode is formed separately for each light-emitting device 100. At this time, the contact electrode 22 and the contact hole 32 exposing the contact electrode 22 may also be arranged for each light-emitting device 100 correspondingly, so that the cathode can contact the contact electrode.

In other embodiments, the cathode layer 50 may also be jointly arranged for multiple or all of the light-emitting devices 100 to form a continuous film layer. At this time, the number of the contact electrodes 22 and the contact holes 32 exposing the contact electrodes 22 is not limited and the positions thereof are not limited.

In order to ensure the display effect of the display panel, the cathode layer 50 may be a transparent electrode layer. In terms of film structure, the cathode layer 50 may be a single-layer film structure or a multi-layer laminated film structure. For example, in the present embodiment, the cathode layer 50 is a single-layer film layer structure for better light transmission effect.

As described above, the transparent electrode layer may be made of transparent materials or translucent materials. The transparent material may be, but not limited to, one or more of indium tin oxide (ITO), indium zinc oxide (IZO), zinc oxide (ZnO), indium oxide (In2O3). In specific implementations, the transparent electrode can be manufactured by sputtering method.

Based on the same concept, the present disclosure further provides a display device, which includes the display panel described in the present disclosure. The specific structure and implementation of the display panel may be referred to the aforementioned descriptions, and no further description is given herein.

It can be understood that for one of ordinary skill in the art, equivalent replacements or changes can be made according to the technical solutions and the invention concept of the present disclosure, and all these changes or replacements shall fall within the scope of the following claims of the present disclosure.

What is claimed is:

1. A display panel, comprising:
    an array substrate;
    an electrode layer, disposed on the array substrate and comprising:
        a metal electrode layer, disposed on the array substrate; and
        at least one transparent electrode layer;
    a light-emitting layer, disposed on the electrode layer; and
    a cathode layer, disposed on the light-emitting layer,
    wherein the electrode layer comprises an anode and a contact electrode disposed apart from each other on the array substrate;
    the contact electrode has a pattern, and the contact electrode contacts the cathode layer through the light-emitting layer; and
    the transparent electrode layer is disposed between the metal electrode layer and the array substrate or the light-emitting layer.

2. The display panel according to claim 1, wherein the display panel further comprises a pixel definition layer disposed between the electrode layer and the light-emitting layer;
    the pixel definition layer has a pixel opening exposing the anode and a contact hole exposing the contact electrode;
    both the light-emitting layer and the cathode layer extend into the contact hole, and the contact electrode contacts the cathode layer through the light-emitting layer in the contact hole.

3. The display panel according to claim 1, wherein the pattern of the contact electrode is a concentric multi-ring pattern.

4. The display panel according to claim 1, wherein the array substrate is provided with an auxiliary electrode, and the auxiliary electrode is electrically connected with the contact electrode.

5. The display panel according to claim 4, wherein the array substrate comprises:
a substrate
a driving circuit layer disposed on the substrate;
a planarization layer disposed on one side of the driving circuit layer away from the substrate;
wherein the anode and the contact electrode are disposed on one side of the planarization layer away from the driving circuit layer, and the auxiliary electrode is disposed in the driving circuit layer and electrically connected with the contact electrode through a via hole.

6. The display panel according to claim 5, wherein the array substrate is further provided with an auxiliary electrode wiring, the auxiliary electrode wiring and the auxiliary electrode are disposed on a same layer, and the auxiliary electrode wiring is electrically connected with the auxiliary electrode.

7. The display panel according to claim 6, wherein an extension direction of the auxiliary electrode wiring is equal to an extension direction of a data line of the driving circuit layer.

8. The display panel according to claim 6, wherein the driving circuit layer comprises a thin film transistor, and the auxiliary electrode and a source and a drain of the thin film transistor are disposed on a same layer.

9. The display panel according to claim 4, wherein the display panel further comprises a pixel definition layer disposed between the electrode layer and the light-emitting layer;
the pixel definition layer has a pixel opening exposing the anode and a contact hole exposing the contact electrode;
both the light-emitting layer and the cathode layer extend into the contact hole, and the contact electrode contacts the cathode layer through the light-emitting layer in the contact hole; and
the array substrate is provided with an auxiliary electrode, and the auxiliary electrode is electrically connected with the contact electrode.

10. The display panel according to claim 4, wherein the pattern of the contact electrode is a concentric multi-ring pattern; and
the array substrate is provided with an auxiliary electrode, and the auxiliary electrode is electrically connected with the contact electrode.

11. A display device comprising a display panel, wherein the display panel comprises:
an array substrate;
an electrode layer, disposed on the array substrate and comprising:
a metal electrode layer, disposed on the array substrate; and
at least one transparent electrode layer;
a light-emitting layer, disposed on the electrode layer; and
a cathode layer, disposed on the light-emitting layer,
wherein the electrode layer comprises an anode and a contact electrode disposed apart from each other on the array substrate;
the contact electrode has a pattern, and the contact electrode contacts the cathode layer through the light-emitting layer; and
the transparent electrode layer is disposed between the metal electrode layer and the array substrate or the light-emitting layer.

12. The display device according to claim 11, wherein the display panel further comprises a pixel definition layer disposed between the electrode layer and the light-emitting layer;
the pixel definition layer has a pixel opening exposing the anode and a contact hole exposing the contact electrode;
both the light-emitting layer and the cathode layer extend into the contact hole, and the contact electrode contacts the cathode layer through the light-emitting layer in the contact hole.

13. The display device according to claim 11, wherein the array substrate is further provided with an auxiliary electrode wiring, the auxiliary electrode wiring and the auxiliary electrode are disposed on a same layer, and the auxiliary electrode wiring is electrically connected with the auxiliary electrode.

14. A display panel, comprising:
an array substrate;
an electrode layer, disposed on the array substrate;
a light-emitting layer, disposed on the electrode layer;
a cathode layer, disposed on the light-emitting layer; and
a pixel definition layer, disposed between the electrode layer and the light-emitting layer,
wherein the electrode layer comprises an anode and a contact electrode disposed apart from each other on the array substrate;
the contact electrode has a pattern, and the contact electrode contacts the cathode layer through the light-emitting layer;
the pixel definition layer has a pixel opening exposing the anode and a contact hole exposing the contact electrode; and
both the light-emitting layer and the cathode layer extend into the contact hole, and the contact electrode contacts the cathode layer through the light-emitting layer in the contact hole.

15. The display panel according to claim 14, wherein the pattern of the contact electrode is a concentric multi-ring pattern.

16. The display panel according to claim 14, wherein the array substrate is provided with an auxiliary electrode, and the auxiliary electrode is electrically connected with the contact electrode.

17. The display panel according to claim 16, wherein the array substrate comprises:
a substrate
a driving circuit layer disposed on the substrate;
a planarization layer disposed on one side of the driving circuit layer away from the substrate;
wherein the anode and the contact electrode are disposed on one side of the planarization layer away from the driving circuit layer, and the auxiliary electrode is disposed in the driving circuit layer and electrically connected with the contact electrode through a via hole.

18. The display panel according to claim 17, wherein the array substrate is further provided with an auxiliary electrode wiring, the auxiliary electrode wiring and the auxiliary electrode are disposed on a same layer, and the auxiliary electrode wiring is electrically connected with the auxiliary electrode.

19. The display panel according to claim 18, wherein an extension direction of the auxiliary electrode wiring is equal to an extension direction of a data line of the driving circuit layer.

20. The display panel according to claim 18, wherein the driving circuit layer comprises a thin film transistor, and the auxiliary electrode and a source and a drain of the thin film transistor are disposed on a same layer.

* * * * *